United States Patent [19]

Janesick

[11] Patent Number: 5,250,824
[45] Date of Patent: Oct. 5, 1993

[54] ULTRA LOW-NOISE CHARGE COUPLED DEVICE

[75] Inventor: James R. Janesick, La Canada, Calif.

[73] Assignee: California Institute of Technology, Pasadena, Calif.

[21] Appl. No.: 881,080

[22] Filed: May 11, 1992

Related U.S. Application Data

[63] Continuation of Ser. No. 575,215, Aug. 29, 1990, abandoned.

[51] Int. Cl.$^5$ .................. H01L 29/78; G11C 19/28; H03K 23/46
[52] U.S. Cl. .................................... 257/216; 257/239; 377/60
[58] Field of Search .................. 257/216, 239; 377/60

[56] References Cited

U.S. PATENT DOCUMENTS

| | | | |
|---|---|---|---|
| 4,040,077 | 8/1977 | Tchon | 257/239 |
| 4,241,421 | 12/1980 | Burke et al. | 257/239 |
| 4,330,753 | 5/1982 | Davy | 377/63 |
| 4,689,808 | 8/1987 | Moorman et al. | 377/60 |
| 4,726,049 | 2/1988 | Boudewijns | 357/24 M |
| 4,939,560 | 8/1990 | Narabu et al. | 357/24 M |
| 4,998,265 | 3/1991 | Kimata | 357/24 |

FOREIGN PATENT DOCUMENTS 59-221083 12/1984 Japan .
1-25560 1/1989 Japan .

OTHER PUBLICATIONS

Baertsch et al., "A New Surface Charge Analog Store", IEEE IEDM, 1973, pp. 134–137.

Primary Examiner—Rolf Hille
Assistant Examiner—Mahshid Saadat
Attorney, Agent, or Firm—Leonard Tachner

[57] ABSTRACT

Special purpose CCD designed for ultra low-noise imaging and spectroscopy applications that require subelectron read noise floors, wherein a non-destructive output circuit operating near its 1/f noise regime is clocked in a special manner to read a single pixel multiple times. Off-chip electronics average the multiple values, reducing the random noise by the square-root of the number of samples taken. Noise floors below 0.5 electrons rms are possible in this manner. In a preferred embodiment of the invention, a three-phase CCD horizontal register is used to bring a pixel charge packet to an input gate adjacent a floating gate amplifier. The charge is then repeatedly clocked back and forth between the input gate and the floating gate. Each time the charge is injected into the potential well of the floating gate, it is sensed non-destructively. The floating gate amplifier is provided with a reference voltage of a fixed value and a pre-charge gate for resetting the amplifier between charge samples to a constant gain. After the charge is repeatedly sampled a selected number of times, it is transferred by means of output gates, back into the horizontal register, where it is clocked in a conventional manner to a diffusion MOSFET amplifier. It can then be either sampled (destructively) one more time or otherwise discarded.

13 Claims, 3 Drawing Sheets

ULTRA LOW-NOISE CHARGE COUPLED DEVICE

ORIGIN OF INVENTION

The invention described herein was made in the performance of work under a NASA contract, and is subject to the provisions of Public Law 96-517 (35 USC 202) in which the Contractor has elected to retain title.

This is a continuation of application Ser. No. 07/575,215 filed Aug. 29, 1990, now abandoned.

TECHNICAL FIELD

The present application relates generally to an ultra low-noise charge coupled device and more specifically to a charge coupled device designed for ultra low-signal level imaging and spectroscopy applications that require sub-electron read noise floors.

BACKGROUND ART

Buried-channel CCD's have often required a bias or fat-zero charge to successfully transfer very small charge packets. The fat-zero applied, usually generated a shot noise component that was higher than the noise produced by the sensor's on-chip amplifier. The Texas Instruments 800×800 3-phase CCD for example, requires a fat-zero of 100 electrons (e-) to fill in a design-induced trap associated with its transfer gate region. Although the on-chip amplifier noise for the Texas Instruments device is only 6e-rms, the fat-zero required for complete transfer, generates a shot noise of 10e-, increasing the overall noise floor of the detector to 11.6e-.

Recent efforts by CCD manufacturers have made notable progress in eliminating design and process-induced trapping centers, similar to those experienced with the noted Texas Instrument CCD. Today, charge transfer efficiency (CTE) performance is usually limited by bulk state traps, small electron traps found naturally in the bulk silicon on which the CCD is made. Current CCD's exhibit near perfect charge transfer efficiency as a result of the high quality silicon that is grown today. For example, a "bulk state limited" CCD can transfer a 10,000 e- charge packet 521 transfers with less than 5 e- deferred without the aid of a fat-zero charge.

Although charge packets of a few electrons can be transferred, the CCD is unable to read the charge accurately because of the relatively high noise floor inherent to the sensor's on-chip amplifier (typically a few electrons rms). Recently, efforts have been directed by CCD manufacturers to break the 1 e- noise barrier so that the high CTE now achieved can be fully exploited.

Theoretically, the read noise for a scientific CCD can be reduced without limit by the amount of process time spent on each pixel. There are, however, practical limits to this procedure. Employing short sample periods, of typically less than 8 microseconds, the noise of CCD's decreases by the square-root of the sample time. However, for longer sample times, the noise only gradually decreases and for some CCD camera systems, the noise actually increases, due to low frequency noise sources encountered (e.g., 1/f noise generated by the CCD amplifier). Current knowledge in minimizing CCD amplifier noise indicates that 2-3 e-noise levels may be the practical limit assuming that conventional output charge detection schemes are utilized (i.e. floating diffusion MOSFET amplifiers).

A book entitled Charge Transfer Devices, by Sequin and Thompsett, published by the Academic Press, Inc. in 1975, discloses at pages 56 and 57 thereof, the concept of utilizing a floating gate amplifier to sense charge transferred in a CCD, non-destructively. They describe what they call a distributed amplifier concept, in which a large number of floating gate amplifiers may be used and their respective signals combined to increase signal-to-noise ratio by a factor equal to the square-root of the number of such amplifier stages. Unfortunately, improving signal to noise ratio in CCD's using such a distributed amplifier scheme is not practical. For one thing, the use of a large number of amplifiers is too complicated, particularly where the signal-to-noise ratio must be improved by factors approaching 100, for example, where 10,000 such amplifiers would have to be provided for processing each pixel. Even if one considers only the additional surface area required to provide such a large number of floating gate amplifiers, the sacrifice for providing a significant improvement in signal-to-noise would be prohibitive. Furthermore, even ignoring the additional surface area required, one then has to confront the problem resulting from offset differences between amplifiers. Providing 10,000 or more floating gate amplifiers on a single integrated circuit chip, all of which amplifiers have identical gains, would be prohibitively expensive and time consuming and thus impractical.

There is therefore an ongoing need for a buried-channel CCD structure which circumvents the 1/f noise problem to provide a square-root reduction in noise and to allow sub-electron noise floors to be realized, but without requiring the use of a large plurality of amplifiers which would otherwise create an impractical circuit configuration.

SUMMARY OF THE INVENTION

The present invention meets the aforementioned need by providing non-destructive sensing of the charge corresponding to a pixel, a large number of times, by using a single floating gate amplifier. This amplifier is used to sample a pixel's charge, a large number of times repeatedly. The samples collected for a given pixel are then averaged together off-chip, reducing the random noise of the on-chip amplifier by the square-root of the number of samples taken. For example, if a given pixel is sampled 100 times, the random noise associated with the on-chip amplifier is diminished by a factor of 10. Thus, the present invention provides a practical single floating gate amplifier implementation of a CCD imaging sensor to circumvent the 1/f noise problem by realizing a square-root reduction in noise, thereby achieving sub-electron noise floors. This repeated sampling by one floating gate amplifier is achieved by using a gating configuration which forces the pixel charge to be transferred into the potential well under the floating gate, causing the voltage at the source of the floating gate amplifier to change in proportion to the amount of charge transferred beneath the floating gate. That voltage is then sampled by off-chip electronics, producing the first sample of that particular pixel. The charge packet is then quickly moved back to an input gate by an appropriate gate clocking sequence. The floating gate is then reset and the cycle is repeated a selected number of times depending upon the final noise level desired. Each time the charge is transferred to the potential well beneath the floating gate, another sample is generated for that same pixel. When the number of desired samples for a pixel have been collected, output gates are activated, forcing charge into a horizontal register which is then clocked, transferring the charge packet to a conventional floating diffusion MOSFET amplifier. At that point the charge is either sampled one more time destructively or otherwise discarded. The novel noise reduction feature of the present invention thus takes advantage of the non-destructive charge-sensing capability of a floating gate amplifier in a CCD structure. However, by repeatedly transferring the charge back and forth from input gates to the sensing amplifier, the present invention provides a unique implementation which requires only one floating gate amplifier to sense the charge repeatedly. Thus the CCD circuit of the present invention avoids the aforementioned disadvantages of the prior art, which uses a large plurality of floating gate amplifiers. In this manner, the novel invention herein disclosed is capable of producing noise floors below 0.5 electrons rms.

OBJECTS OF THE INVENTION

It is therefore a principal object of the present invention to provide a novel CCD image sensing implementation in which the charge corresponding to a single pixel of an image plane is repeatedly transferred back and forth through the potential well of a floating gate amplifier and the voltage corresponding to the charge sensed during each such passage of charge is averaged with all other sensed charges in subsequent passages thereof, to reduce the noise level of the sensing amplifier by a factor proportional to the square-root of the number of such transfers.

It is an additional object of the present invention to provide a non-destructive floating gate amplifier configuration in a CCD image sensing arrangement, whereby the charge of a single pixel is repeatedly sensed and averaged over a large number of samples by repeatedly transferring such charge back and forth into the potential well of a single floating gate sensing amplifier.

It is still an additional object of the present invention to provide a novel CCD imaging sensor wherein the charge corresponding to each pixel of such CCD imaging sensor is repeatedly transferred into the Potential well of a single floating gate amplifier, which thus repeatedly and non-destructively generates a voltage proportional to such charge over a large plurality of samples, whereby the voltages corresponding to all such samples may be averaged thereby reducing the corresponding noise level by the square-root of the number of such samples, and wherein a unique reference voltage resetting capability is provided for assuring constant amplifier characteristics for each such sampling event.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the following drawings in which.

DETAILED DESCRIPTION OF A PREFERRED EMBODIMENT

Figure 1:
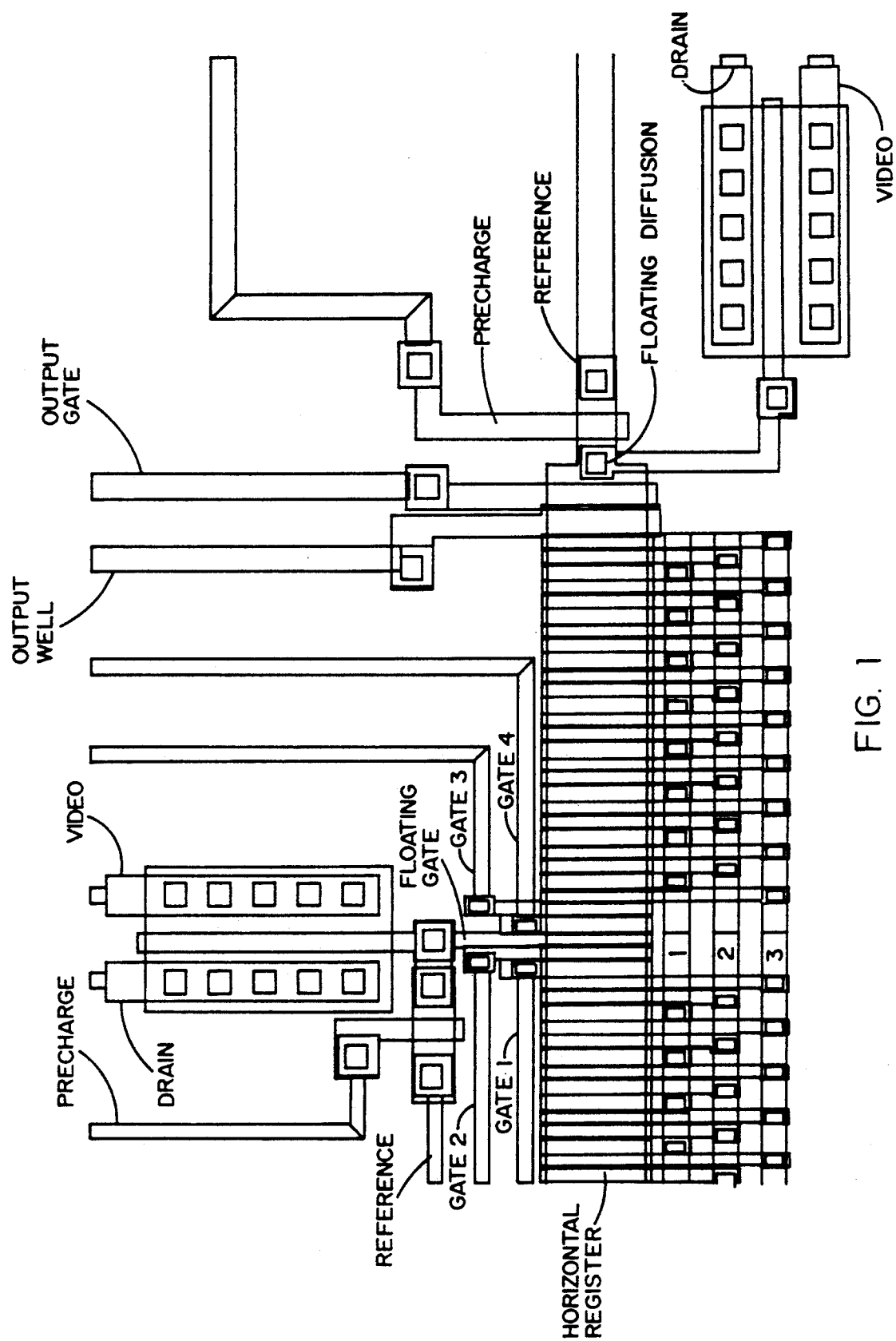
FIG. 1 is a design layout of a CCD structure fabricated in accordance with the present invention.

Referring to FIG. 1, it will be seen that a preferred embodiment of the CCD structure of the present invention, comprises a three-phase horizontal register having a plurality of conventional three-phase clocking electrodes for transferring charge from left to right, as viewed in FIG. 1. Towards the left portion of the horizontal register, the invention provides a floating gate electrode, of a floating gate amplifier which is used to detect signal charge in the buried channel of the CCD structure as the charge is transferred from left to right in the horizontal register. The floating gate is connected to a MOSFET source follower amplifier and to a MOSFET reset switch. The reset switch is used to preset the gate of the floating gate amplifier to a reference voltage before signal charge is dumped into the potential well underneath the floating gate. As seen further in FIG. 1, there are four gates adjacent the floating gate, two on either side thereof. More specifically, as seen in FIG. 1, gates 1 and 2 are positioned to the left of the floating gate and gates 3 and 4 are positioned to the right of the floating gate.

As also shown in FIG, 1, the drain terminal of the floating gate amplifier used to sense the charge of each pixel, is designated the reference terminal and the conventional gate terminal of the floating gate amplifier is designated the precharge terminal. The reference and precharge terminals of the floating gate amplifier, are used to reset the floating gate to a fixed gate voltage after each pixel charge is.. transferred to the floating gate, so that the amplifier characteristics will be identical from sample-to-sample. In this way voltage differences corresponding to even small charge differences from pixel-to-pixel or sample-to-sample, may be accurately sensed, Thus, the reference terminal is connected to a fixed voltage and the precharge terminal is pulsed periodically between samples to permit the reference voltage level to reach the floating gate of the floating gate amplifier after each sampling of charge has been completed. As seen further in FIG. 1, the floating gate amplifier is connected at the source of a source-follower amplifier, which enables transfer of the voltage corresponding to the sensed charge to off-chip conventional averaging circuits.

The output end of the horizontal register, that is, the right-most portion of the horizontal register as seen in FIG. 1, is connected to an output well and an output gate. The output well provides a means of pixel binning for accumulating charge of a plurality of pixels for even further increasing the signal-to-noise ratio in those cases where a sacrifice in video resolution can be tolerated. The output gate reduces clock feed-through to a conventional floating diffusion MOSFET amplifier, which is connected to the right-most end of the horizontal register by means of a floating diffusion. This conventional MOSFET floating diffusion amplifier also provides a precharge and reference terminal for amplifier reset. Unlike the floating gate MOSFET amplifier used to generate multiple samples of the pixel charge in the manner to be described hereinafter, the floating diffusion amplifier at the output of the horizontal register, does not employ a floating gate structure and is thus a "destructive" amplifier which effects one last sample and then is used to effectively discard the sample charge after the number of desired samples has been taken.

Figure 2:
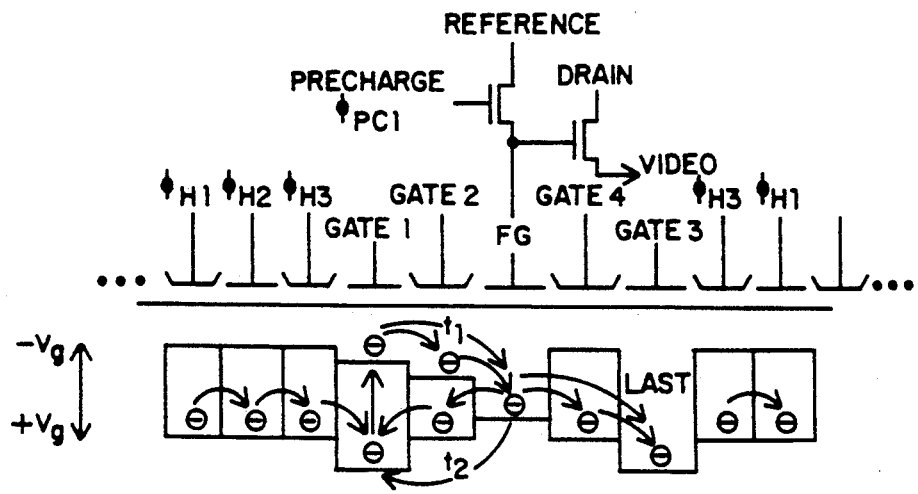
FIG. 2 is a combined CCD schematic and potential well drawing for the CCD structure shown in FIG. 1.
Figure 3:
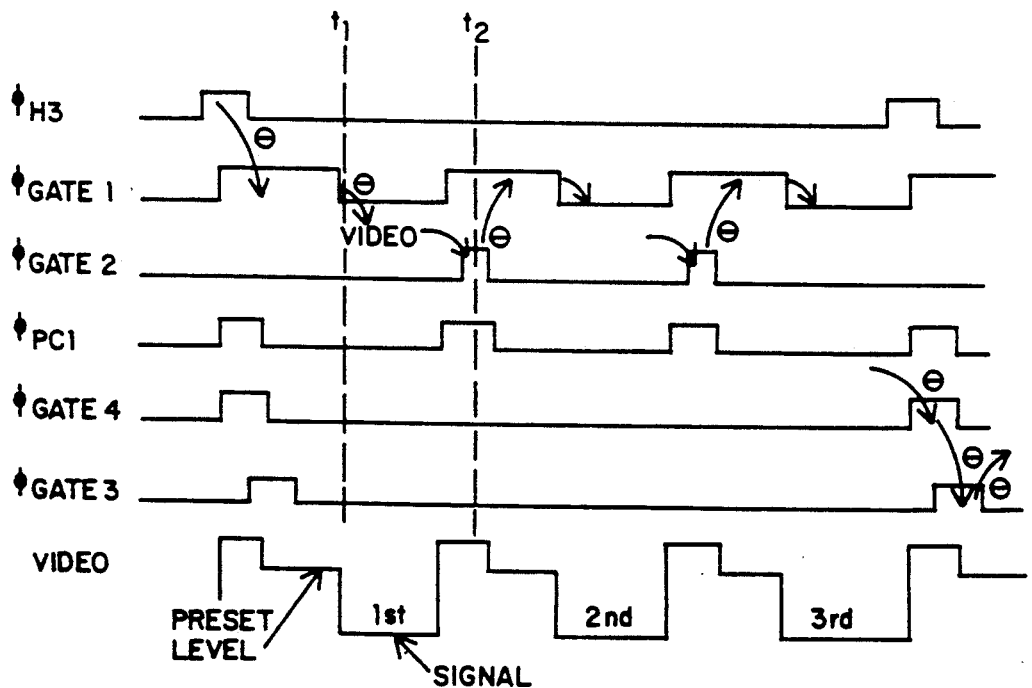
FIG. 3 is a timing diagram for the CCD structure shown in FIG. 1.

The sequence of operation of the present invention may be best understood by referring to FIG. 1, along with the charge transfer sequence illustrated in FIG. 2 and the timing sequence illustrated in FIG. 3. Operation begins by conventionally clocking the horizontal register using the three phase clocking electrodes attached thereto below the horizontal register, as seen in FIG. 1. One pixel charge is clocked in this conventional manner, until the charge corresponding to one pixel is transferred into gate 1, as illustrated in FIG. 2. The horizontal register clocks are then inhibited for the duration of the sample sequencing cycle, and shortly thereafter, the floating gate is preset to the reference voltage by pulsing the precharge electrode of the amplifier. Gate 1 of the floating gate amplifier is then clocked low, forcing the pixel charge to be sampled, to be transferred through gate 2 and into the potential well under the floating gate. The voltage at the output source of the amplifier changes in proportion to the amount of charge transferred beneath the floating gate. The voltage is then sampled by off-chip electronics, resulting in the sensing of the first sample for that pixel. The charge packet is then quickly moved back to gate 1 by clocking gates 2 and 1 high and thereby completing one sample of the sequence. The floating gate is then reset a second time and the above noted cycle is repeated. This sequence may be repeated as many times as desired depending upon the final noise level required. Each time the charge is transferred into the potential well below the floating gate, a subsequent sample of that charge, in the form of the voltage at the output of the amplifier, is again collected by off-chip electronics.

When all of the desired samples for the given pixel are collected, gates 3 and 4 are then activated, forcing the charge back into the horizontal register at horizontal register gate 3. Then, normal three-phase clocking of the horizontal register is reactivated. As the horizontal register is clocked in a conventional manner, the pixel's charge packet is transferred to the conventional floating diffusion MOSFET amplifier at the right of the horizontal register. At this point, it can be sampled again (only once for this type of amplifier) and discarded through a second reset MOSFET. The floating diffusion MOSFET amplifier assures that at least one sample of the video image pixel may be obtained even if there is a failure in the floating gate amplifier. This feature of the invention is particularly important from the standpoint of reliability in spacecraft applications. However, even more importantly, the combination in the present invention of multiple sampling non-destructive floating gate amplifier and conventional floating diffusion MOSFET amplifier (which does destroy the charge), provides a CCD image sensor configuration which permits conventional single sample processing of video images along with selective ultra low-noise multiple sample processing for desired portions of such images. Such a combined capability is particularly advantageous in spacecraft applications, such as for use in spacecraft-based telescope applications, where only relatively small portions of the image are of interest and need be studied in greater detail with significantly improved signal-to-noise ratios. Thus, the present invention may be used more efficiently by selectively sensing uninteresting portions of an overall image in a conventional manner, with only one sample per pixel, thus permitting the greatest amount of time of processing to be spent analyzing the more interesting portions of an image with far greater signal-to-noise performance.

Figure 4:
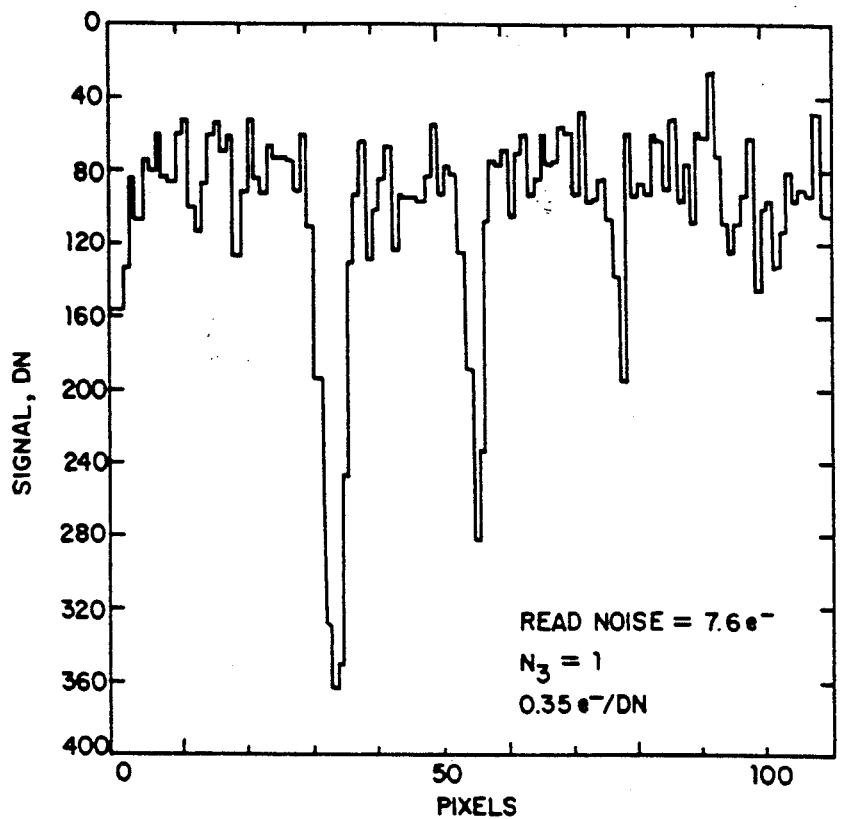
FIG. 4 is a video line trace graph for one sample per pixel of a CCD image sensing device upon which four point sources of light are incident.
Figure 5:
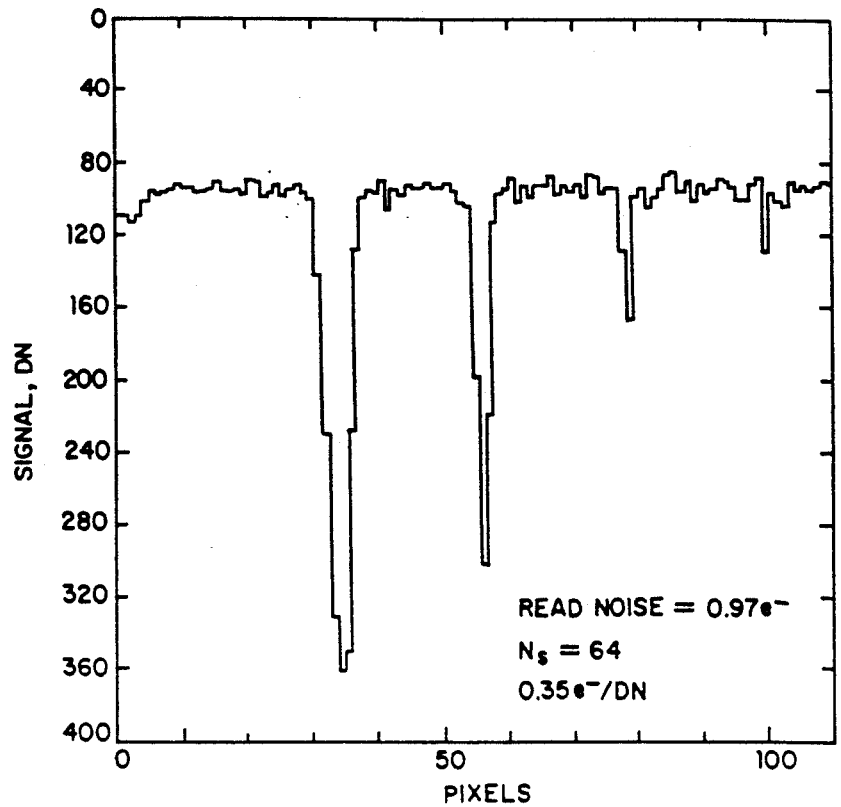
FIG. 5 is a line trace graph, similar to that of FIG. 4, but illustrating the significant reduction in noise associated therewith as a result of taking 64 samples per pixel by using the unitary floating gate amplifier CCD structure of the present invention.

The improvement in noise reduction performance provided by the multiple-sampling capability of the present invention, may be observed by comparing FIGS. 4 and 5. More specifically, FIG. 4 illustrates line traces taken through four point images in an image plane, wherein one sample per pixel is used. As can be seen in FIG. 4, the read noise is 7.6 electrons rms. On the other hand, FIG. 5 illustrates the same four point images, employing 64 samples per pixel by sampling the charge per pixel 64 times in accordance with the previously described implementation of FIG. 1. The read noise level in the 64 sample per pixel case of FIG. 5 is measured at 0.97 electrons rms or substantially the square-root of the number of samples. By comparing the line traces of FIG. 4 and 5, it will be seen that the noise improvement performance of the present invention is particularly advantageous where single sample processing would produce marginal signal-to-noise ratios. Thus for example, the point image occurring at approximately pixel 100 in the graph of FIGS. 4 and 5, is virtually undiscernable in FIG. 4 from the background read noise. On the other hand, that pixel signal is clearly discernable in FIG. 5, where the signal-to-noise ratio has been improved by a factor of 8 as a result of the 64-sample processing provided by the floating gate amplifier configuration of the invention.

Actually fabricated CCD structures of the present invention exhibit single sample noise levels that range between 6–10 electrons rms. By employing 64 samples per pixel, the noise levels for the same CCDs have been reduced to the range of 0.75 to 1.25 electrons rms. In fact, noise levels below 0.5 electrons rms have been achieved by employing 256 samples per pixel. It has been found that by using appropriate cooling, clockwave shaping and voltage bias reduction to the CCD, a square-root noise reduction relationship can be achieved at even more than 256 samples per pixel. Such extreme noise reduction is available in non-visible light portions of the image spectrum where shot noise limitations are not encountered.

It will now be understood that what has been disclosed herein comprises a novel, special purpose CCD designed for ultra low-noise imaging and spectroscopy applications that require sub-electron read noise floors, wherein a non-destructive output circuit operating near its 1/f noise regime is clocked in a special manner to read a single pixel multiple times. Off-chip electronics average the multiple values, reducing the random noise by the square-root of the number of samples taken. Noise floors below 0.5 electrons rms are possible in this manner. In a preferred embodiment of the invention, a three-phase CCD horizontal register is used to bring a pixel charge packet to an input gate adjacent a floating gate amplifier. The charge is then repeatedly clocked back and forth between the input gate and the floating gate. Each time the charge is injected into the potential well of the floating gate, it is sensed non-destructively. The floating gate amplifier is provided with a reference voltage of a fixed value and a pre-charge gate for resetting the amplifier between charge samples to a constant gain. After the charge is repeatedly sampled a selected number of times, it is transferred by means of output gates, back into the horizontal register, where it is clocked in a conventional manner to a diffusion MOSFET amplifier. It can then be either sampled (destructively) one more time or otherwise discarded. While the present invention is not the first to use a floating gate amplifier for increasing signal-to-noise ratios in a CCD image sensing structure, it is believed to be the first to employ a gating sequence which repeatedly passes a pixel charge back and forth into and out of the potential well of a unitary floating gate amplifier to repeatedly sense the same pixel charge value, using one floating gate such amplifier. In this manner, the present invention provides a practical solution to a long f el t need for reducing the read noise floor of a video image CCD structure by a factor equal to the square-root of the number of such samples. The output of the floating gate amplifier is connected to a conventional source follower amplifier which transfers the voltage corresponding to each sensed pixel charge to an off-chip averaging circuit which ultimately provides a single averaged value having a signal-to-noise ratio which is improved by the square-root of the number of samples taken. Thus for example, if a pixel is sampled 100 times, the random noise associated with the on-chip amplifier is diminished by a factor of 10. The preferred embodiment of the present invention also provides a conventional floating diffusion MOSFET amplifier at the end of a horizontal register. This amplifier can be used to sample the pixel charge packet one last time before it is discarded. This conventional MOSFET amplifier configuration also permits conventional, single sample processing of the video image over the majority of the image. Such conventional processing may be used to find selected portions of high interest which may be subsequently sampled using the noise reduction multiple sample capability of the floating gate amplifier portion of the invention. Thus the present invention provides a unique combination of highly improved ultra low-noise signal processing and conventional single sample signal processing in the same CCD structure, either of which sampling process may be selected, depending upon the signal-to-noise ratio of that pixel or the interest in that portion of the overall image.

Those having skill in the art to which the present invention pertains will now, as a result of the applicants teaching herein, perceive various modifications and additions which may be made to the invention. By way of example, while a preferred embodiment of the invention has been disclosed herein as having a three-phase CCD buried channel structure, it will be understood that the present invention may be readily provided in other CCD configurations such as those which use a different number of clocking phases. If fact, it will now be observed that a number of alternative conventional CCD structures may be utilized in combination with the multiple sampling floating gate non-destructive characteristics of the present invention to achieve the significant noise reduction performance thereof. Accordingly, all such modifications and additions are deemed to be within the scope of the invention, which is to be limited only by the claims appended hereto.

I claim:

1. An electronic apparatus for providing an ultra-low noise sensing of charge; the apparatus comprising:
  a buried-channel charge-coupled device having a floating gate amplifier with a potential well;
  said device also having means for repeatedly transferring a charge to be sensed into and out of said potential well sequentially for generating a corresponding plurality of charge-sensing voltages, each such voltage corresponding to the respective magnitude of the sensed charge transferred into said potential well; said transferring means including at least one input gate in said device adjacent said floating gate and means for clocking said charge back and forth between said input gate and said floating gate; and
  means for averaging said plurality of voltages for improving by a factor dependent upon the number of transfers of said charge into said potential well, the signal-to-noise ratio of an output signal representing the magnitude of said sensed charge.

2. The apparatus recited in claim 1 further comprising means for resetting said floating gate amplifier to a pre-selected precise gain prior to each transfer of said sensed charge into said potential well.

3. The apparatus recited in claim 1 further comprising means for terminating said repeated transferring and discarding said sensed charge.

4. The apparatus recited in claim 3 wherein said terminating and discarding means comprises at least one output gate adjacent said floating gate and a charge-destructive sensing amplifier positioned on said charge-coupled device for receiving said sensed charge from said output gate.

5. The apparatus recited in claim 1 wherein each said charge corresponds to a pixel of an image.

6. The apparatus recited in claim 4 further comprising means positioned between said output gate and said charge-destructive sensing amplifier for accumulating sensed charges.

7. The apparatus recited in claim 4 further comprising means for selectively causing charge to bypass said floating gate amplifier and be sensed only once by said charge-destructive sensing amplifier.

8. An electronic apparatus for sensing charges such as charges corresponding to pixels of an image and for increasing the signal-to-noise ratio of such sensed charges by repeatedly sensing a charge a selected plurality of times; the apparatus comprising:
  a charge-coupled device having a charge transfer register and a floating gate amplifier having a floating gate with a potential well in said register;
  said device also having sampling means for repeatedly transferring a charge to be sensed, into and out of said potential well sequentially for generating a plurality of sequential charge-sensing voltages, each such voltage corresponding to the respective magnitude of the sensed charge transferred into said potential well, said sampling means including at least one input gate adjacent said floating gate and means for clocking a sensed charge back and forth between said input gate and said floating gate; and
  means for averaging said plurality of voltages to provide an improvement, dependent upon the number of clockings of said sensed charge back and forth between said input gate and said floating gate, of the signal-to-noise ratio of an output signal representing the magnitude of said sensed charge.

9. The apparatus recited in claim 8 further comprising means for resetting said floating gate amplifier to a pre-selected precise gain prior to each transfer of said sensed charge into said potential well.

10. The apparatus recited in claim 8 further comprising means for terminating said repeated transferring and discarding said sensed charge.

11. The apparatus recited in claim 10 wherein said terminating and discarding means comprises at least one output gate adjacent said floating gate and a charge-destructive sensing amplifier positioned on said charge-coupled device for receiving said sensed charge from said output gate.

12. The apparatus recited in claim 11 further comprising means positioned between said output gate and said charge-destructive sensing amplifier for accumulating sensed charges.

13. The apparatus recited in claim 11 further comprising means for selectively causing charge to bypass said floating gate amplifier and be sensed only once by said charge-destructive sensing amplifier.

* * * * *